(12) United States Patent
Chen et al.

(10) Patent No.: US 8,217,488 B2
(45) Date of Patent: Jul. 10, 2012

(54) GAN LIGHT EMITTING DIODE AND METHOD FOR INCREASING LIGHT EXTRACTION ON GAN LIGHT EMITTING DIODE VIA SAPPHIRE SHAPING

(75) Inventors: Shiue-Lung Chen, Taoyuan (TW); Jeng-Guo Feng, Taoyuan (TW); Jang-Ho Chen, Taoyuan (TW); Ching-Hwa Chang Jean, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 182 days.

(21) Appl. No.: 12/838,557

(22) Filed: Jul. 19, 2010

(65) Prior Publication Data
US 2012/0012856 A1    Jan. 19, 2012

(51) Int. Cl.
*H01L 21/00* (2006.01)
(52) U.S. Cl. .......... 257/507; 257/76; 257/352; 257/615; 438/29; 438/37; 438/46
(58) Field of Classification Search ............. 257/76, 257/352, 507, 615; 438/29, 37, 46
See application file for complete search history.

(56) References Cited

U.S. PATENT DOCUMENTS

| 6,069,394 | A  | * | 5/2000  | Hashimoto et al. | 257/466 |
| 6,949,395 | B2 | * | 9/2005  | Yoo              | 438/47  |
| 7,638,414 | B2 | * | 12/2009 | Choi et al.      | 438/483 |
| 7,687,811 | B2 | * | 3/2010  | Jang et al.      | 257/84  |
| 8,080,818 | B2 | * | 12/2011 | Tanaka           | 257/13  |
| 2005/0003632 | A1 | * | 1/2005 | Onishi et al.   | 438/462 |
| 2009/0146165 | A1 | * | 6/2009 | Hasnain et al.  | 257/98  |

* cited by examiner

*Primary Examiner* — Jarrett Stark
*Assistant Examiner* — Nicholas Tobergte
(74) *Attorney, Agent, or Firm* — Bacon & Thomas, PLLC

(57) ABSTRACT

A method for enhancing light extraction efficiency of GaN light emitting diodes is disclosed. By cutting off a portion from each end of bottom of a sapphire substrate or forming depressions on the bottom of the substrate and forming a reflector, light beams emitted to side walls of the substrate can be guided to the light emitting diodes.

15 Claims, 10 Drawing Sheets

GAN LIGHT EMITTING DIODE AND METHOD FOR INCREASING LIGHT EXTRACTION ON GAN LIGHT EMITTING DIODE VIA SAPPHIRE SHAPING

FIELD OF THE INVENTION

The present invention relates to a method for enhancing light extraction efficiency of GaN light emitting diodes. More particularly, the present invention relates to a method for enhancing light extraction on GaN light emitting diodes by shaping a sapphire substrate thereof so that light beams generated from an active region emitting to the sapphire substrate can be guided to the light emitting diodes.

BACKGROUND OF THE INVENTION

External quantum efficiency (EQE) of a light emitting diode (LED) is dominated by its internal quantum efficiency (IQE) and light extraction efficiency (LEE). Internal quantum efficiency (IQE) is related to the transition of the photons generated from an active layer when electrons inject into LEDs. Light extraction efficiency is the ability that the light from the active layer emits to medium surrounded. With development of epitaxy technology, Internal lighting efficiency can be up to 80%. However, light extraction efficiency is still low. For example, refraction index of GaN materials is about 2.5 at the range of blue wavelength. The air around them has refraction index of 1. Due to total reflection, the light extraction efficiency in the interface is only 10~12%.

In addition, light emitting diodes having traditional large size luminescent layers (having area greater than 1 mm×1 mm) usually encounter waveguide effect. Photons are limited in the light emitting diode and rebound within the internal materials so that they are absorbed to lower light extraction efficiency. Due to the fact that phosphors are difficult to be evenly spread on side walls of a light emitting diode package for generating white light, only a limited range of phosphors can be excited, such that light beams from the side walls have little contribution to white light generation. Hence, the entire light extraction efficiency is not good.

Furthermore, the appearance of a traditional light emitting diode is a rectangular pillar. It is another factor causing low light extraction efficiency. Because refraction indexes of semiconductor and package materials are far from that of the air, it makes total reflection angle small. Therefore, photons have little chance to escape from the light emitting diodes. They will be reflected back repeatedly until being absorbed.

In order to solve the problems leading to low light extraction efficiency mentioned above, several inventions had provided better solutions. Please refer to FIG. 1. U.S. Pat. No. 6,229,160 has disclosed a method for designing semiconductor light emitting devices such that the side surfaces (surfaces not parallel to the epitaxial layers) are formed at preferred angles relative to vertical (normal to the plane of the light-emitting active layer) to improve light extraction efficiency and increase total light output efficiency. Device designs are chosen to improve efficiency without resorting to excessive active area-yield loss due to shaping. It is the first one to use truncated inverted pyramid structured light emitting diode and provides light extraction efficiency up to 100 1 m/W. However, it is not suitable for GaN light emitting diodes. The key issue is that GaN light emitting diodes usually use sapphire ($Al_2O_3$) as a substrate. Sapphire is very hard to be shaped by mechanical process. '160 patent is not commercially useful.

In order to overcome the aforementioned problems, U.S. Pat. No. 6,768,136 provides an improved method. '136 patent uses silicon carbide (SiC) or gallium nitride (GaN) as the material for substrate. With change of the shape of the light emitting diodes, light extraction efficiency can be as good as that mentioned in '160 patent while mechanical process can be easily applied to the substrate. However, silicon carbide and gallium nitride are very expensive to be used as the substrate. It is not workable to replace sapphire with such expensive materials. Therefore, a better invention is still desired.

Obviously, from the above description, the substrate of the light emitting diodes remarkably influences the light extraction efficiency. A better designed substrate can provide more light beams to be released from the light emitting diodes and a competitive manufacturing cost. Hence, the present invention is brought up to provide an excellent solution to all the problems. It can also improve light extraction efficiency of a packaged light emitting diode.

SUMMARY OF THE INVENTION

The goal of the present invention is to increase light extraction efficiency of a GaN light emitting diode. It is achieved by shaping the bottom surface of the light emitting diode with laser etching. With a reflector formed below the light emitting diode, most light beams generated from the light emitting diodes toward the substrate can be led out.

In accordance with an aspect of the present invention, a method for enhancing light extraction efficiency of a GaN light emitting diode, comprises the steps of: a) providing a GaN light emitting diode having a sapphire substrate which includes a patterned top surface and a bottom surface opposite to the patterned top surface; b) machining the sapphire substrate by cutting off a portion from each end of bottom of the sapphire substrate to form a slope or by creating a plurality of depressions on the bottom surface of the sapphire substrate; and c) enveloping a lower portion of the sapphire substrate in a reflector for reflecting light from the sapphire substrate, thereby enhancing light extraction efficiency of the GaN light emitting diode.

Preferably, the reflector comprises silver, aluminum, or a distributed Bragg reflector (DBR).

Preferably, the present invention further comprises a step d) of encompassing the reflector with a reflective adhesive.

Preferably, the reflective adhesive contains silver or aluminum.

Preferably, the cut-off portion has a height larger than 50 μm.

Preferably, the slope has an inclination angle greater than 45° with respect to the bottom surface.

Preferably, the step b) is performed by laser cutting, dry etching, photolithography, or inductively coupled plasma etching.

Preferably, the depression has a depth larger than 50 μm.

In accordance with another aspect of the present invention, a GaN light emitting diode with enhanced light extraction efficiency, comprises: a GaN light emitting diode having a sapphire substrate which includes a patterned top surface and a bottom surface opposite to the patterned top surface, the sapphire substrate having a slope on each end of bottom of the sapphire substrate or a plurality of depressions on the bottom surface of the sapphire substrate; and a reflector enveloping a lower portion of the sapphire substrate for reflecting light from the sapphire substrate, thereby enhancing light extraction efficiency of the GaN light emitting diode.

Preferably, the reflector comprises silver, aluminum, or a distributed Bragg reflector (DBR).

Preferably, the invention further comprises a reflective adhesive encompassing the reflector.

Preferably, the reflective adhesive contains silver or aluminum.

Preferably, the slope has an inclination angle greater than 45° with respect to the bottom surface.

Preferably, the slope and the depressions are formed by laser cutting, dry etching, photolithography, or inductively coupled plasma etching.

Preferably, the depression has a depth larger than 50 μm.

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
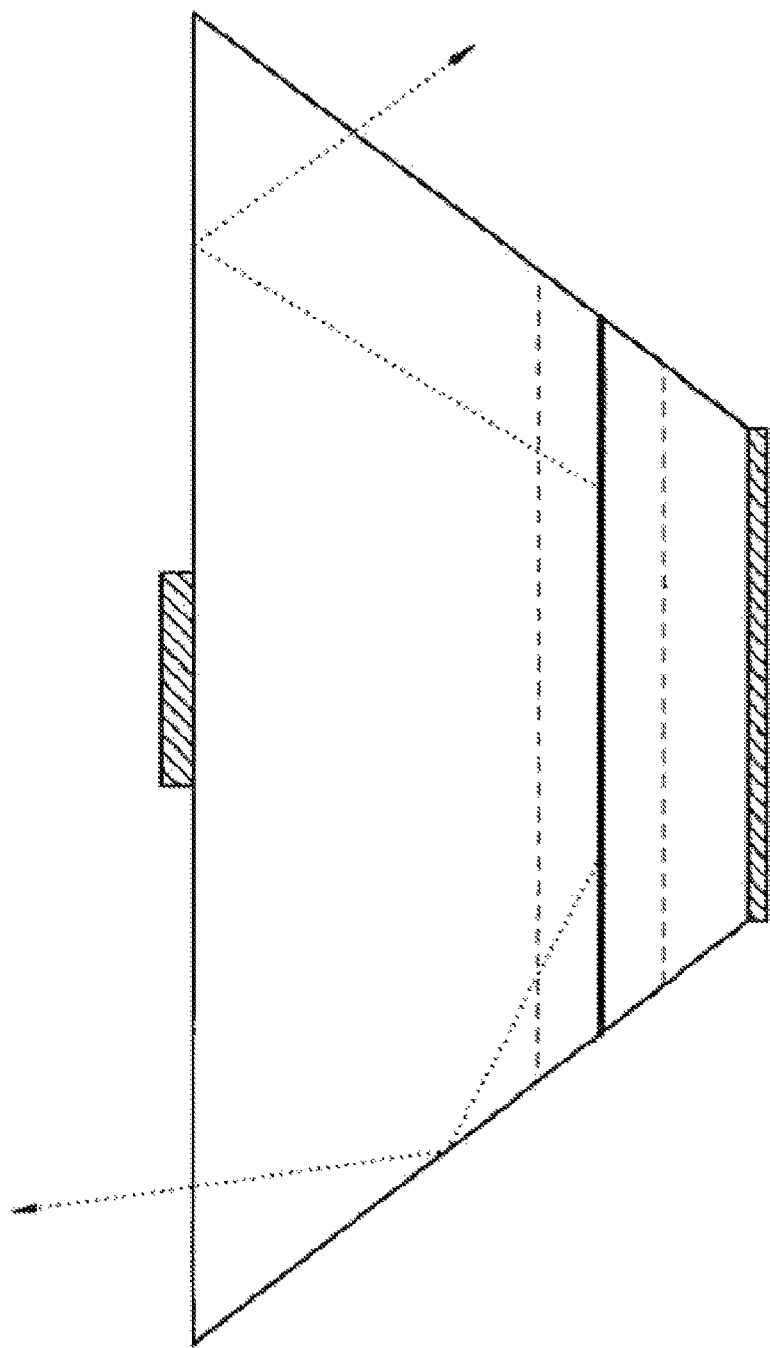
FIG. 1 shows a prior art light emitting diode.
Figure 2:
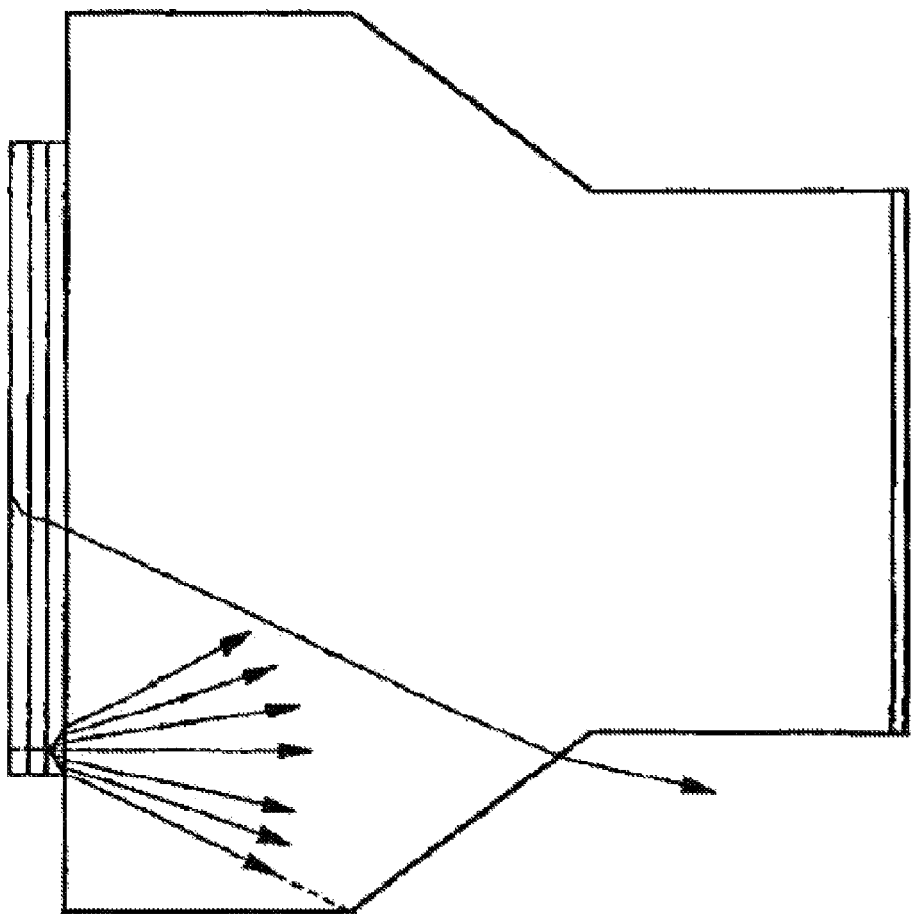
FIG. 2 shows another prior art light emitting diode.
Figure 3:
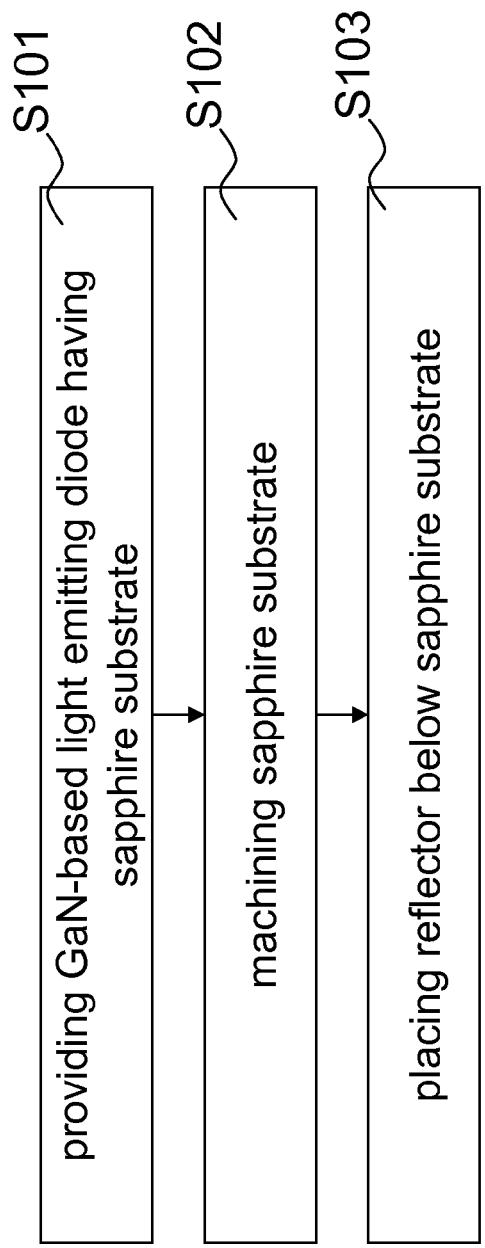
FIG. 3 is a flow chart according to the present invention.
Figure 4:
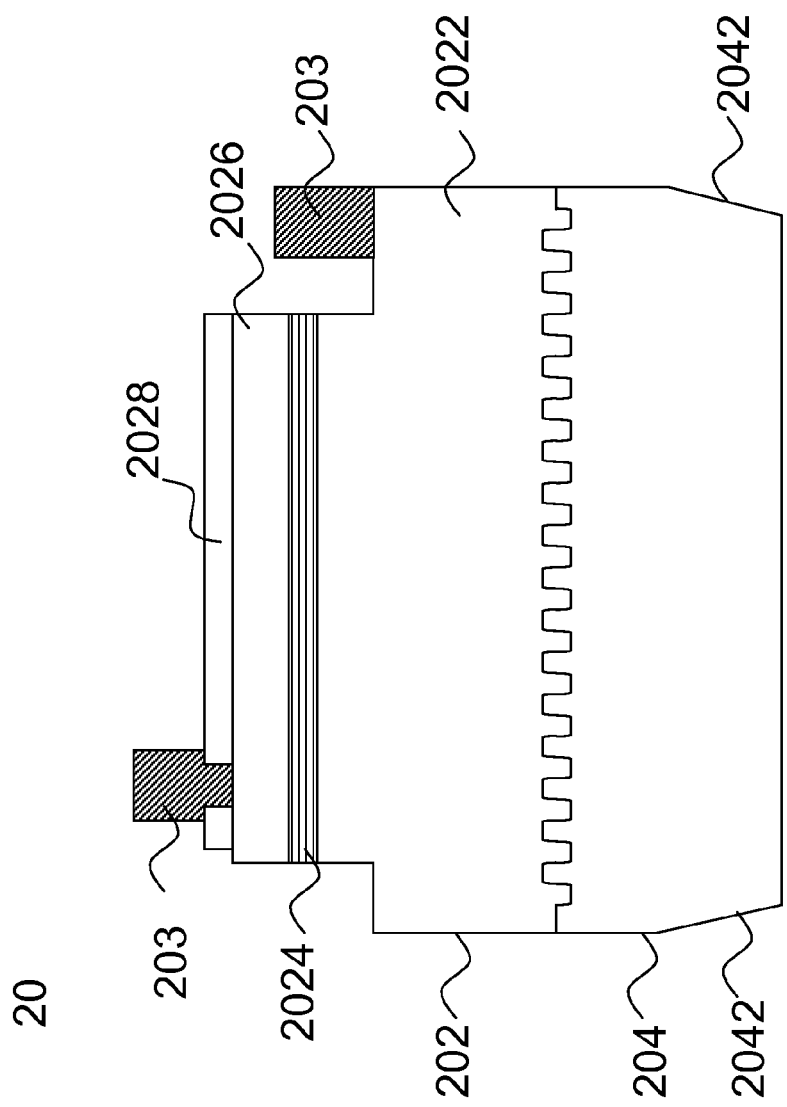
FIG. 4 illustrates a GaN light emitting diode according to the first embodiment.

In order to have full understanding of the present invention, three embodiments are described below.
First Embodiment Please refer to FIG. 3 to FIG. 7. FIG. 3 is a flow chart showing steps for enhancing light extraction efficiency of a GaN light emitting diode. FIG. 4 shows a GaN light emitting diode 20 including a sapphire substrate 204, electrodes 203 and the epitaxial layer 202. The sapphire substrate 204 includes a patterned top surface and a bottom planar surface opposite to the patterned top surface (step S101). The epitaxial layer 202 comprises an n-GaN layer 2022, a multiple quantum well 2024, a p-GaN layer 2026 and a transparent conducting layer (TCL) 2028. Light beams excited from the multiple quantum well 2024 will emit in all directions. Some light beams emit upward and out of the light emitting diode 20 via the transparent conducting layer (TCL) 2028, some light beams emit towards the side walls of the light emitting diode 20, and still some light beams emit towards the sapphire substrate 204 and are absorbed or reflected back. Most of the reflected light beams will finally be absorbed by the internal materials of the light emitting diode 20 and won't be released, thereby causing low light extraction efficiency.

The sapphire substrate 204 has a portion cut off by a laser from each end of bottom thereof to form two slopes 2042 (step S102). In practice, dry etching, photolithography, or inductively coupled plasma etching can also be used for cutting the sapphire substrate 204 as long as the slopes 2042 can be well formed. Each slope 2042 has a height D. Generally, the height D is larger than 50 μm to get better light extraction efficiency.

Figure 5:
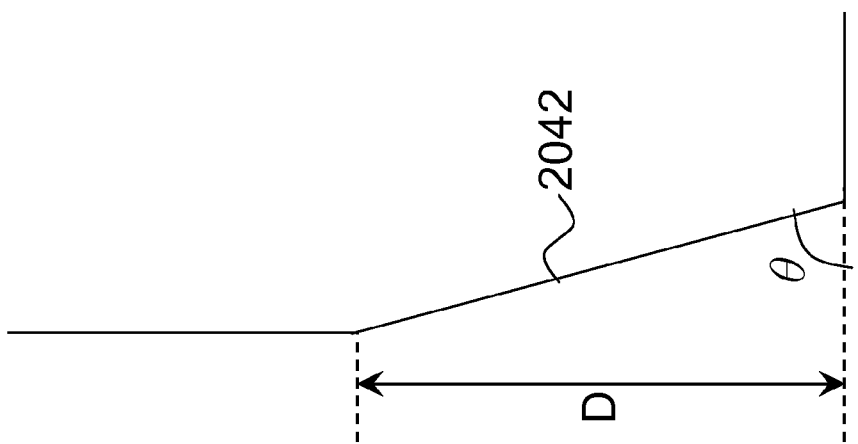
FIG. 5 defines an inclination angle in the first embodiment.

Please see FIG. 5. An inclination angle θ between the slope 2042 and the bottom surface of the sapphire substrate 204 is defined. In the present invention, the inclination angle θ is greater than 45°.

Figure 6:
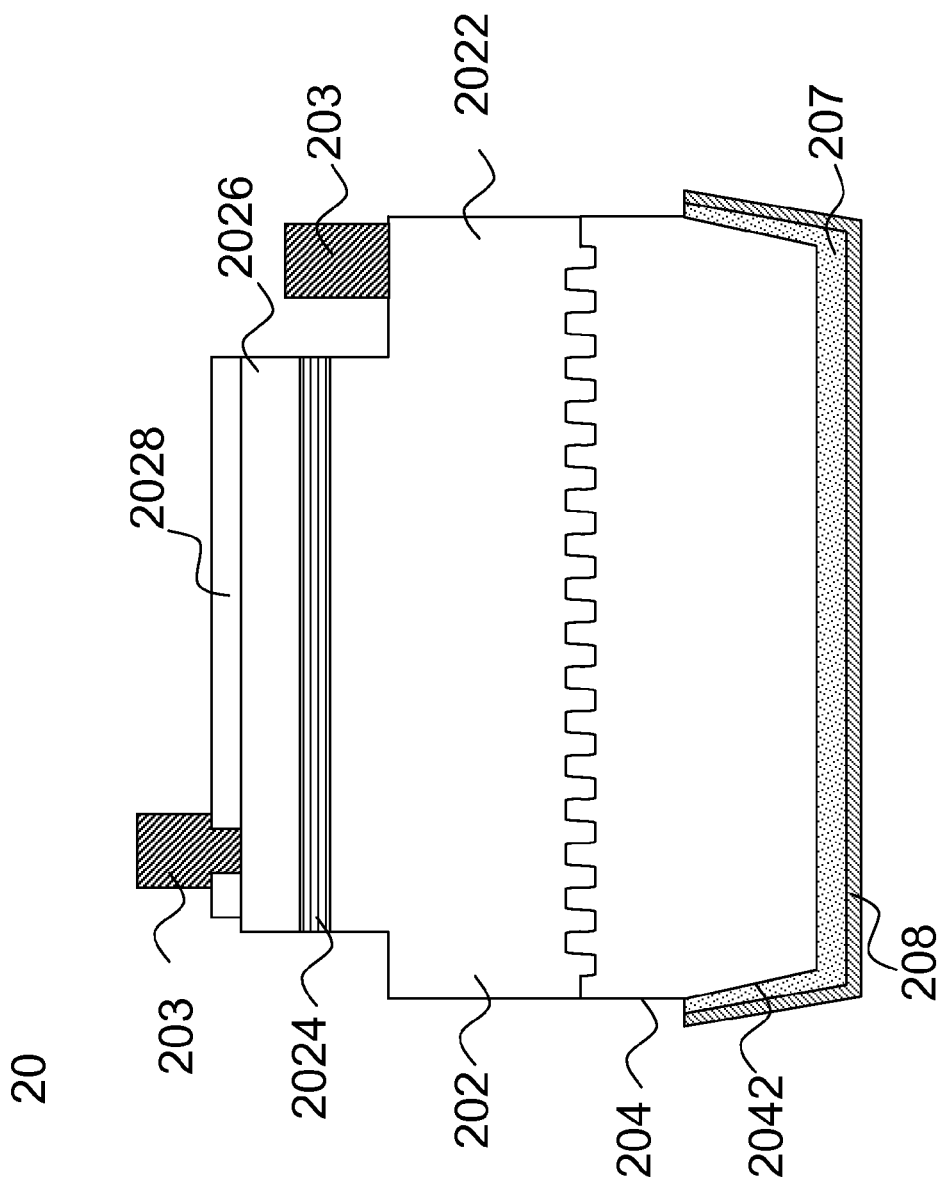
FIG. 6 illustrates a GaN light emitting diode having a reflector according to the first embodiment.

Please refer to FIG. 6. Last, a lower portion of the sapphire substrate 204 is enveloped in a reflector 207 (step S103). The reflector 207 is used for reflecting light beams from the sapphire substrate 204, thereby enhancing light extraction efficiency of the GaN light emitting diode 20. In the present invention, the reflector 207 is made of high reflective materials such as silver or aluminum, or is a distributed Bragg reflector (DBR) which utilizes the refractive index differences to achieve interferometric effects by forming periodic multilayer quarter wave stacks with alternating high and low refractive index layers. The reflector 207 is encompassed with a layer of reflective adhesive 208 to reflect light beams scattered from the reflector 207. The reflective adhesive 208 can be glue including silver or aluminum so that the reflection effect can be better. Although most light beams from the epitaxial layer 202 can be reflected by the reflector 207, some light beams that are not reflected by the reflector 207 can instead be reflected by the reflective adhesive 208. On the other hand, the larger the inclination angle θ is, the more light beams can easy directly guide outside the sidewall of sapphire. Hence, more light beams can be generated from the GaN light emitting diode 20.

Figure 7:
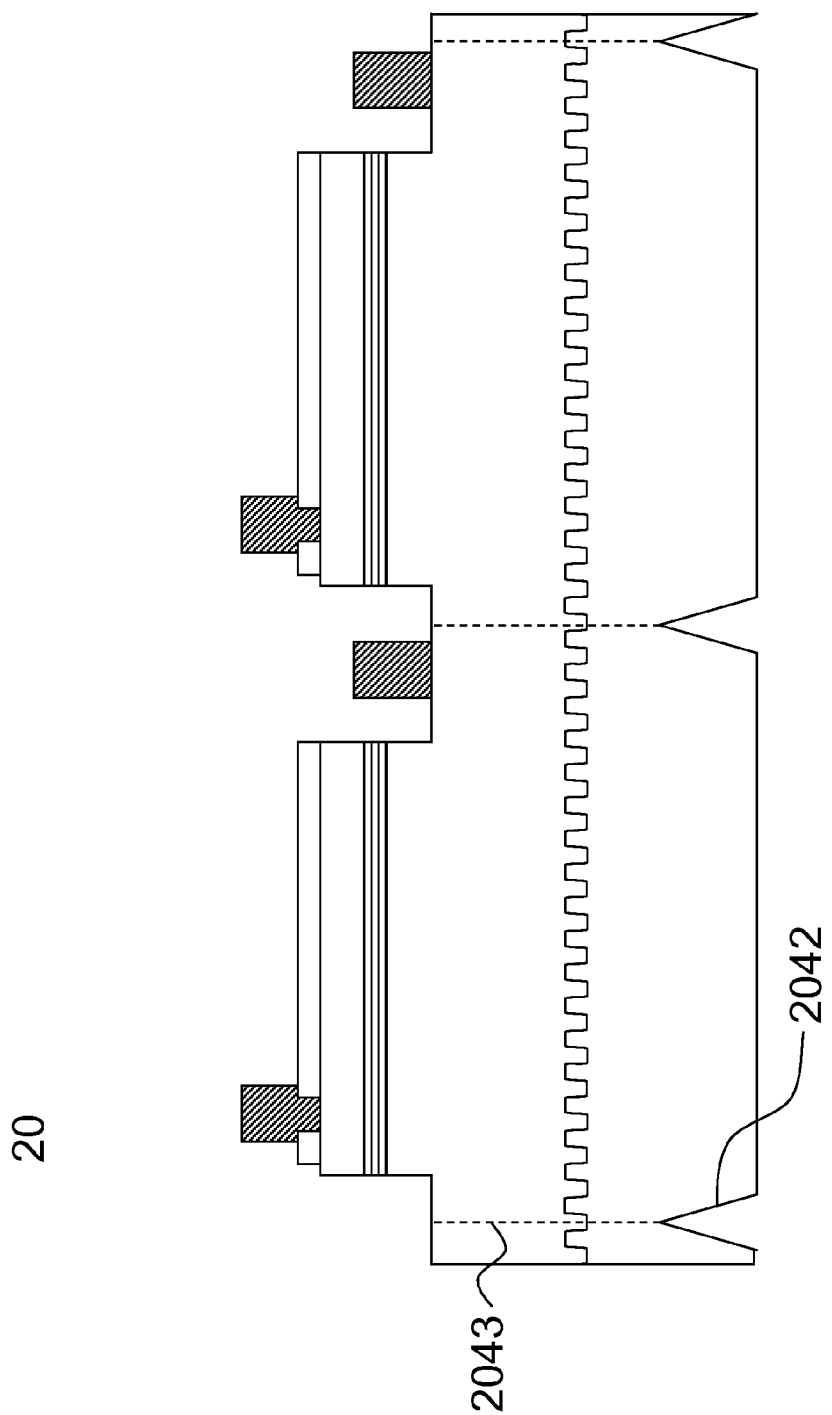
FIG. 7 illustrates two GaN light emitting diodes used in the first embodiment.
Figure 8:
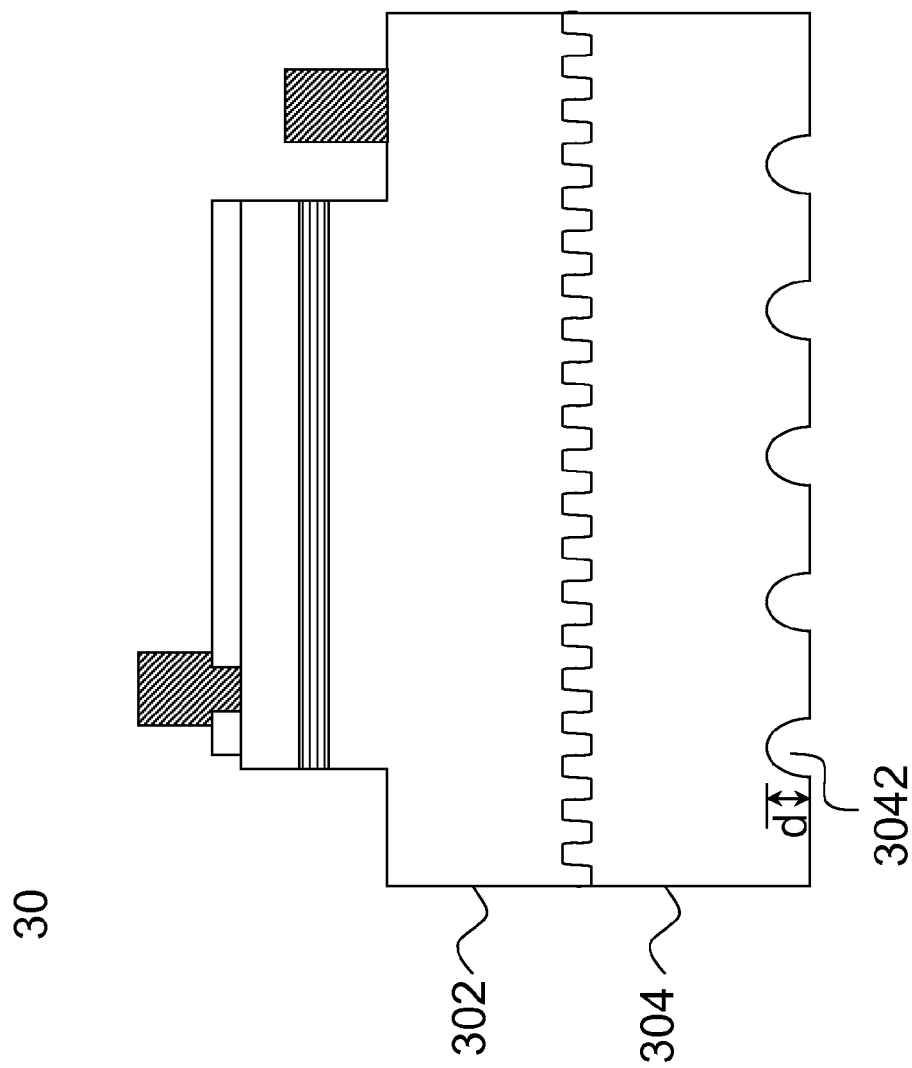
FIG. 8 illustrates a GaN light emitting diode according to a second embodiment.
Figure 9:
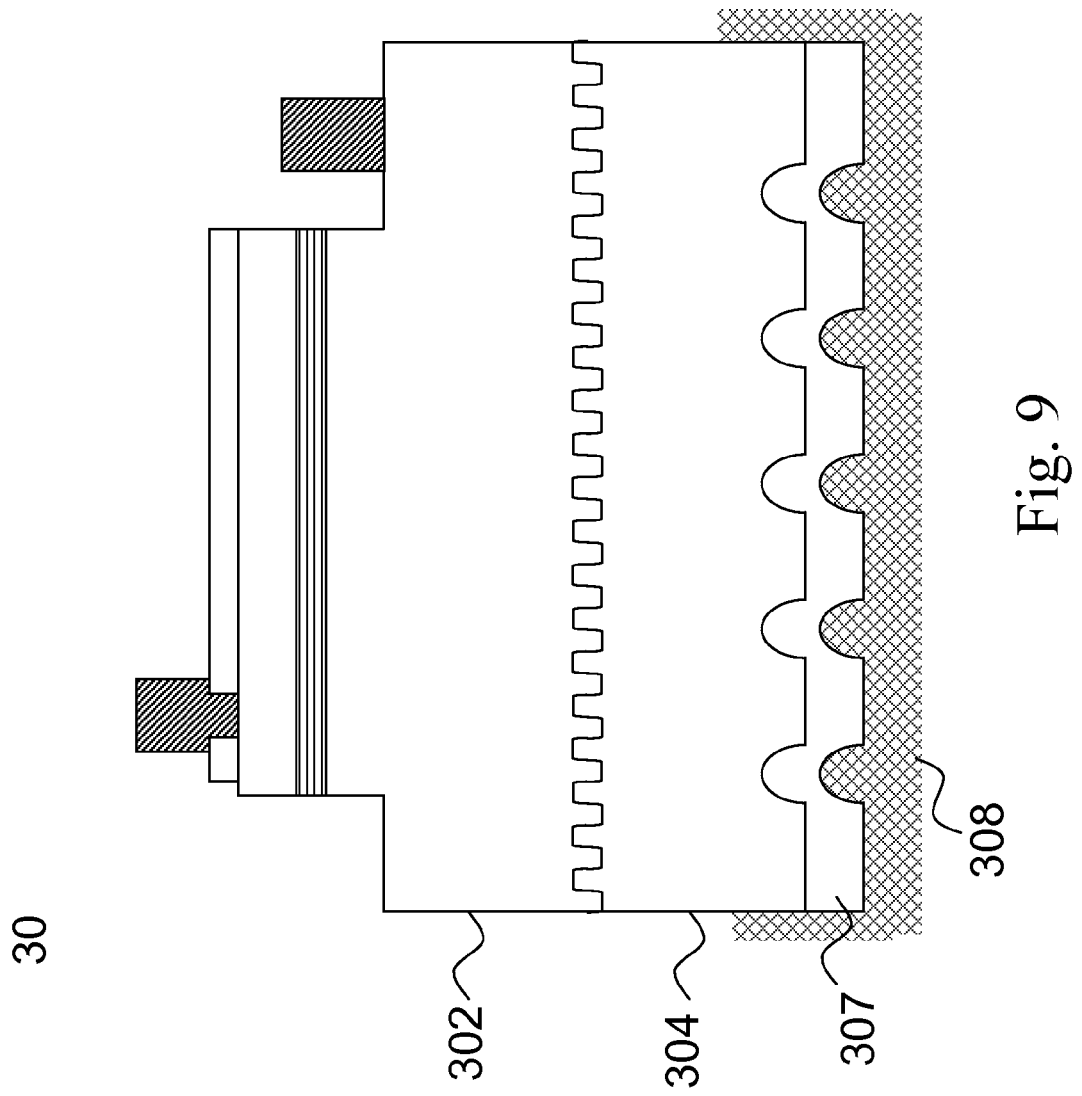
FIG. 9 illustrates a GaN light emitting diode having a reflector according to the second embodiment.

Of course, the present invention is not limited to only one light emitting diode. Laser cutting can be used not only to form the slope on the substrate, but also to dice a substrate having lots of light emitting diodes formed thereon into individual light emitting diodes. Two GaN light emitting diodes 20 which are to be diced are shown in FIG. 7. During the dicing process, a number of V-shaped grooves having a slope 2042 are formed on the bottom of the substrate 204. A dicing line 2043 can be extended from the tip of the V-shaped groove. After the dicing process, the reflector 207 is formed.
Second Embodiment In addition to cutting off a portion from bottom of a sapphire substrate to form slopes, the present invention uses another approach to enhance light extraction efficiency of a GaN light emitting diode. The alternative is creating some depressions on the bottom surface of the sapphire substrate Please refer to FIGS. 8 and 9. A second embodiment is illustrated. FIG. 8 shows a GaN light emitting diode 30 comprising a sapphire substrate 304 and the epitaxial layer 302. The sapphire substrate 304 includes a patterned top surface and a bottom surface opposite to the patterned top surface. Since electrodes and detailed structure of the epitaxial layer 302 are the same as those in the first embodiment and have nothing to do with the present embodiment, descriptions of these elements are omitted. The second embodiment relates to how to treat light beams emitted from the epitaxial layer 302 to the sapphire substrate 304.

Laser is used to etch the sapphire substrate 304 to form depressions 3042 on the bottom surface of the sapphire substrate 304 for guiding light beams generated from the light emitting diodes toward the lower portion of the sapphire substrate 304 to lead out from the side walls of the sapphire substrate 304. The depressions 3042 have a depth d. Generally, the depth d is larger than 50 μm to get better light extraction efficiency. Shape of the depressions 3042 on the bottom surface of the sapphire substrate 304 is not limited. It can be circular, hexagonal, or triangular in practice.

As illustrated in the first embodiment, a lower portion of the sapphire substrate 304 is enveloped in a distributed Bragg reflector 307. Then, the reflector 307 is encompassed with a layer of glue 308 which may include silver or aluminum for reflecting light beams scattered from the reflector 307. With the distributed Bragg reflector 307, light beams from the epitaxial layer 302 can be reflected. With the reflector 307, most light beams generated from the light emitting diodes toward the substrate can be led out. Meanwhile, the deeper the etched hole 3042 is made, the better heat dissipation effect the GaN light emitting diodes 30 will have after the GaN light emitting diodes 30 is packaged.

Third Embodiment

Figure 10:
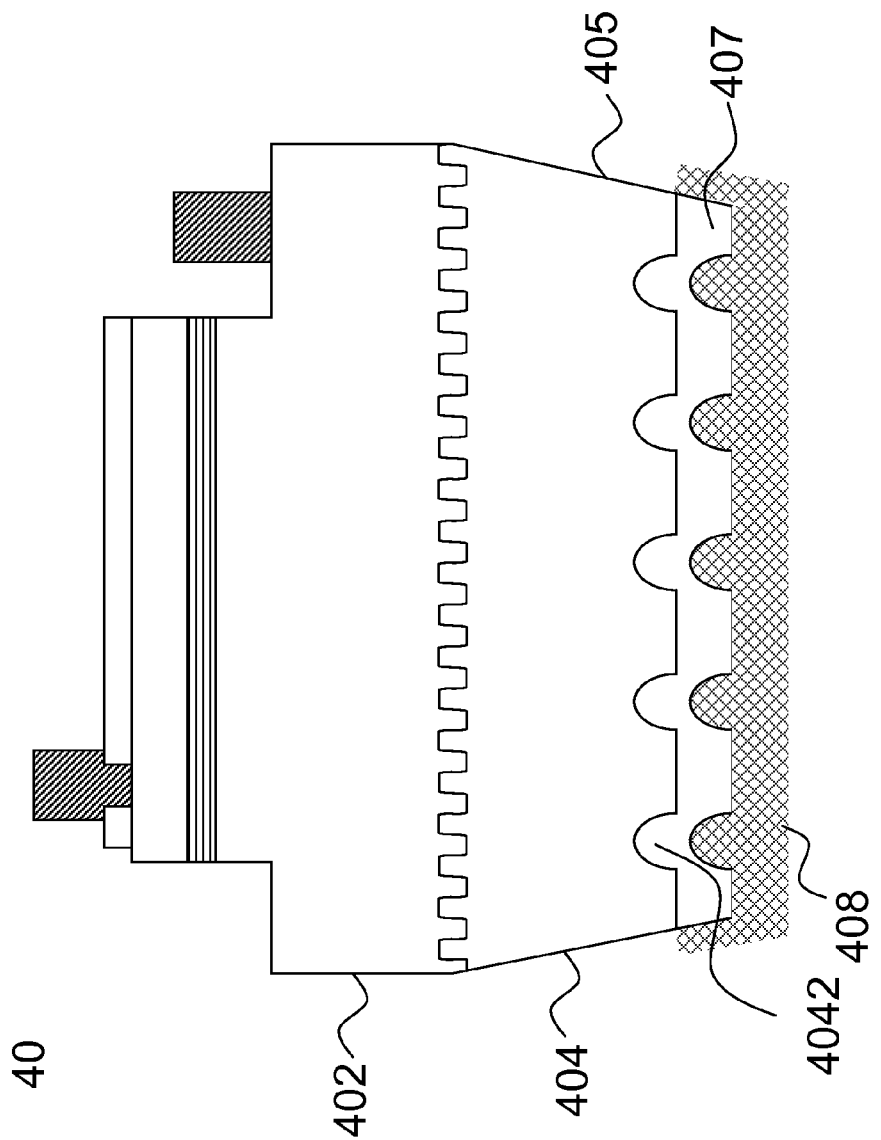
FIG. 10 illustrates a GaN light emitting diode according to a third embodiment.

A third embodiment is illustrated in FIG. 10. FIG. 10 shows a GaN light emitting diodes 40 comprising a sapphire substrate 404 and an epitaxial layer 402. Slopes 405 and depressions 4042 are both formed. This embodiment combines the advantages for enhancing light extraction efficiency in the previous two embodiments. Finally, a lower portion of the sapphire substrate 404 is enveloped in a distributed Bragg reflector 407. A layer of silver glue 408 is applied below the distributed Bragg reflector 407 and on slopes 405 of the sapphire substrate 404 for reflecting light from the slopes 405 of the sapphire substrate 404. As we can expect, the present embodiment has good light extraction efficiency due to increase of side light beams. Of course, it also has better heat dissipation effect for the GaN light emitting diodes 40 after it is packaged.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for increasing light extraction on GaN light emitting diode via sapphire shaping, comprising the steps of:
   a) providing a GaN light emitting diode having a sapphire substrate which includes a patterned top surface and a bottom surface opposite to the patterned top surface;
   b) machining the sapphire substrate by cutting off a portion from each end of bottom of the sapphire substrate to form a slope or by creating a plurality of depressions on the bottom surface of the sapphire substrate; and
   c) enveloping a lower portion of the sapphire substrate in a reflector for reflecting light from the sapphire substrate, thereby enhancing light extraction efficiency of the GaN light emitting diode.

2. The method according to claim 1, wherein the reflector comprises silver, aluminum, or a distributed Bragg reflector (DBR).

3. The method according to claim 1, further comprising a step d) of encompassing the reflector with a reflective adhesive.

4. The method according to claim 3, wherein the reflective adhesive contains silver or aluminum.

5. The method according to claim 1, wherein the cut-off portion has a height larger than 50 μm.

6. The method according to claim 1, wherein the slope has an inclination angle greater than 45° with respect to the bottom surface.

7. The method according to claim 1, wherein step b) is performed by laser cutting, dry etching, photolithography, or inductively coupled plasma etching.

8. The method according to claim 1, wherein the depression has a depth larger than 50 μm.

9. A GaN light emitting diode, comprising:
   a GaN light emitting diode having a sapphire substrate which includes a patterned top surface and a bottom surface opposite to the patterned top surface, the sapphire substrate having a slope on each end of bottom of the sapphire substrate or a plurality of depressions on the bottom surface of the sapphire substrate; and
   a reflector enveloping a lower portion of the sapphire substrate for reflecting light from the sapphire substrate, thereby enhancing light extraction efficiency of the GaN light emitting diode.

10. The GaN light emitting diode according to claim 9, wherein the reflector comprises silver, aluminum, or a distributed Bragg reflector (DBR).

11. The GaN light emitting diode according to claim 9, further comprising a reflective adhesive encompassing the reflector.

12. The GaN light emitting diode according to claim 11, wherein the reflective adhesive contains silver or aluminum.

13. The GaN light emitting diode according to claim 9, wherein the slope has an inclination angle greater than 45° with respect to the bottom surface.

14. The GaN light emitting diode according to claim 9, wherein the slope and the depressions are formed by laser cutting, dry etching, photolithography, or inductively coupled plasma etching.

15. The GaN light emitting diode according to claim 9, wherein the depression has a depth larger than 50 μm.

* * * * *